United States Patent
Hung et al.

(10) Patent No.: US 7,057,296 B2
(45) Date of Patent: Jun. 6, 2006

(54) BONDING PAD STRUCTURE

(75) Inventors: Meng-Chi Hung, Douliou (TW);
Shang-Yung Hou, Hsinchu (TW);
Shin-Puu Jeng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 70 days.

(21) Appl. No.: 10/696,186

(22) Filed: Oct. 29, 2003

(65) Prior Publication Data

US 2005/0093176 A1 May 5, 2005

(51) Int. Cl.
*H01L 23/48* (2006.01)
(52) U.S. Cl. ...................... 257/786; 257/782
(58) Field of Classification Search .............. 257/786, 257/782, 680, 690, 693, 701
See application file for complete search history.

(56) References Cited

U.S. PATENT DOCUMENTS

| | | | | |
|---|---|---|---|---|
| 4,341,594 | A | * 7/1982 | Carlson et al. | 438/704 |
| 6,426,555 | B1 | * 7/2002 | Hsia et al. | 257/734 |
| 6,552,438 | B1 | 4/2003 | Lee et al. | 257/784 |
| 6,566,752 | B1 | 5/2003 | Hsia et al. | 257/734 |

* cited by examiner

*Primary Examiner*—Douglas W Owens
(74) *Attorney, Agent, or Firm*—Thomas, Kayden, Horstemeyer & Risley

(57) ABSTRACT

A substrate has a bonding region and a sensing region. A first dielectric layer is formed overlying the substrate and has a dielectric island surrounded by a ring-shaped trench. A first conductive layer is formed in the ring-shaped trench of the first dielectric layer. A passivation layer is formed overlying the first dielectric layer and has an opening, in which the opening corresponds to the bonding region and the sensing region and exposes the dielectric island and a part of the first conductive layer. A second conductive layer covers the opening of the passivation layer and is electrically connected to the first conductive layer.

35 Claims, 14 Drawing Sheets

BONDING PAD STRUCTURE

BACKGROUND OF THE INVENTION

1. Field of the Invention

The invention relates to integrated circuits, and more particularly to a bonding pad structure.

2. Description of the Related Art

Bonding pads are interfaces between integrated circuits contained in semiconductor chips and a device package. Modern IC designs with high circuit density require a significantly increased number of pins and bonding pads to reduce bonding pad pitch and size. Large mechanical stresses inherent in bonding operations, however, easily damage smaller bonding pads.

Traditionally, each bonding pad is connected to one or more contact pads on an IC-mounting surface of the device package through wire-bonding, tape automated bonding (TAB) or flip-chip technologies. When an IC chip is probed in an electrical test or the like, a probe pin may damage the soft surface of the bonding pad. The Cu layer beneath the AlCu pad is exposed to air, and may be corroded. The corroded pads caused by this type of pad voids degrade the bondability of wire connection. Currently, a top copper layer of a solid profile is used for connecting an aluminum pad, but has disadvantages of pad voids, narrow bondability window, ball lifting and dielectric crack issues. Accordingly, several modifications of the top copper layer have been developed as listed below. Moreover, in order to overcome this problem, the bonding pad has been divided into a bonding pad region and a sensing pad region, and the probe pin is brought into contact only with the sensing pad region which is allowed to be damaged.

As disclosed in U.S. Pat. No. 6,552,438, one conventional bonding pad comprises a plurality of independent metal plugs formed in an array of via holes of an inter-dielectric layer, in which each metal plug has a bottom portion connected to a lower aluminum layer and a top portion connected to an upper aluminum pad. Moreover, a passivation layer is formed on the aluminum pad to expose a predetermined bonding area for bonding a wire. Another conventional bonding pad comprises a top metal layer filling a lattice trench of an inter-dielectric layer for surrounding dielectric islands. A passivation layer is also formed on the top metal layer to expose a predetermined bonding area for forming an aluminum pad, thus allowing a ball to be bonded on the aluminum pad.

The above-described bonding pads, however, have the following disadvantages. During wafer sorting, wire bonding or probe pin testing, applied forces or large mechanical stresses may crack the inter-dielectric layer adjacent to a probe pin region. Second, the crack may extend into the interior of the inter-dielectric layer surrounding the top metal layer, causing corrosion and layer-open problems. This also causes the aluminum pad to peel from the top metal layer, thus the pad-open problem causes the wire to lose contact with the aluminum pad, decreasing bonding reliability. Additionally, the pitch and size of the bonding pad cannot be further shrinked as the bonding pad is susceptible to damage from the mechanical stress, thus limiting chip size reduction in next generation technologies. Fourth, during wire bonding, a high distribution ratio of the independent metal plugs or the dielectric islands may create a pad finding issue.

As disclosed in U.S. Pat. No. 6,566,752, another conventional bonding pad comprises a top metal ring formed in a trench of an inter-dielectric layer. A passivation layer with a plurality of via holes is formed on the inter-dielectric layer to expose the top metal ring. An aluminum pad is formed on the passivation layer and is electrically connected to the top metal ring through via holes. However, the width of the top metal ring is limited by the via hole design, resulting in a misalignment problem during photolithography, which prohibits bonding pad fabrication within active areas.

SUMMARY OF THE INVENTION

Accordingly, an object of the present invention is to provide a top metal layer design for a bonding pad structure to obtain a metal-free area or a small metal area under a metal pad within a sensing region.

According to the object of the invention, a bonding pad structure comprises a substrate having a bonding region and a sensing region. A first dielectric layer is formed overlying the substrate and has a dielectric island surrounded by a ring-shaped trench. A first conductive layer is formed in the ring-shaped trench of the first dielectric layer. A passivation layer is formed overlying the first dielectric layer and has an opening, in which the opening corresponds to the bonding region and the sensing region and exposes the dielectric island and a part of the first conductive layer. A second conductive layer covers the opening of the passivation layer and is electrically connected to the first conductive layer.

Another object of the present invention is to provide a passivation opening design for a bonding pad structure to protect a top metal layer under a metal pad within a sensing region.

According to the object of the invention, a bonding pad structure comprises a substrate having a bonding region and a sensing region. A first dielectric layer is formed overlying the substrate and has a trench. A first conductive layer is formed in the trench of the first dielectric layer. A passivation layer is formed overlying the first dielectric layer and has an opening corresponding to the bonding region, wherein the passivation layer covers the first conductive layer formed within the sensing region. A second conductive layer covers the opening of the passivation layer and is formed overlying the sensing region. The second conductive layer is electrically connected to the first conductive layer.

DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

The present invention provides a top metal layer design for a bonding pad structure to obtain a metal-free area or a small metal area under a metal pad within a sensing region. The present invention additionally provides a passivation opening design for a bonding pad structure to protect a top metal layer under a metal pad within a sensing region. The present invention effectively prevents corrosion in the top metal layer due to probing, lengthens the bondability window, eliminates cracks in the under-layer dielectrics, and prevents peeling of the metal pad from the under-layer dielectrics. The present invention also improves pad finding capability (pad recognition capability), reduces pad pitch, and allows the bonding pad structures to be located over peripheral circuit areas, active areas, scribe lines or a combination thereof.

Figure 1:
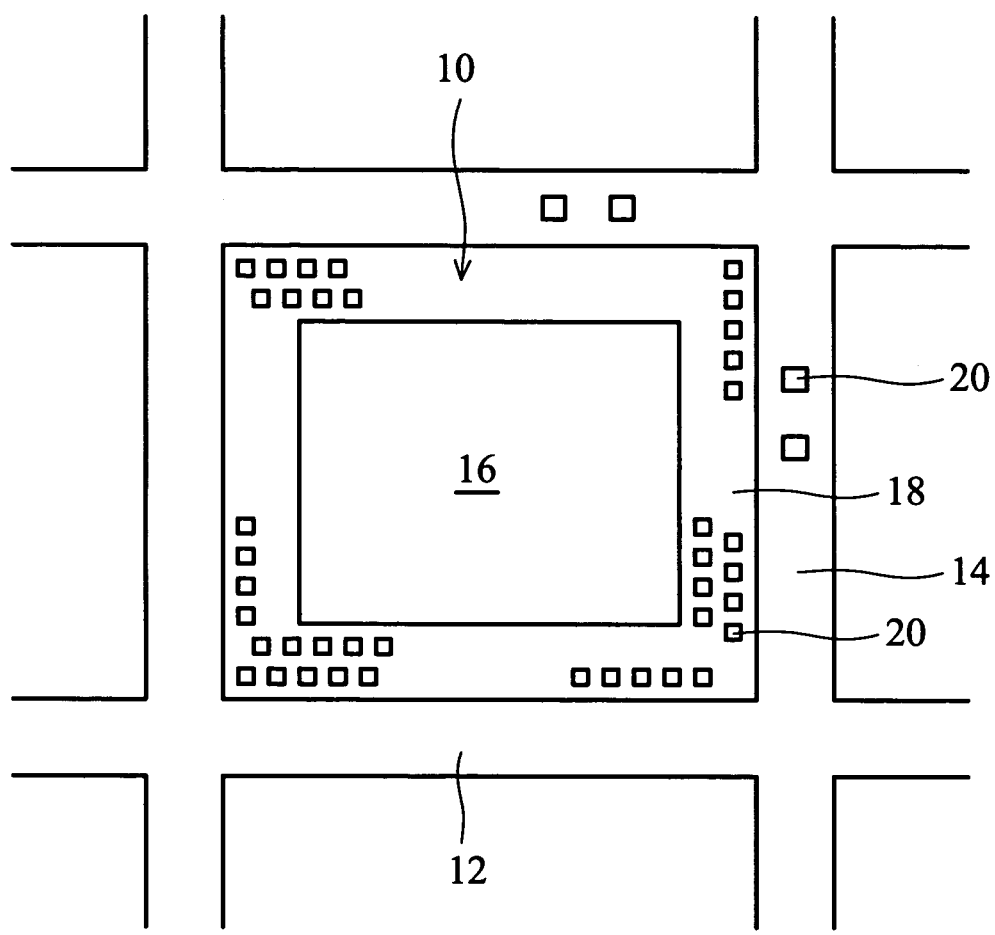
FIG. 1 is a top view of an individual chip including bonding pad structures of the present invention.

FIG. 1 is a top view of an individual chip including bonding pad structures of the present invention. A semiconductor wafer comprises substantially isolated chips, and the isolated chip comprises a main area 10 defined by first scribe lines 12 extending in a first direction and second scribe lines 14 extending in a second direction. The individual chip 10 containing circuitry comprises an active area 16 and a peripheral area 18. A plurality of bonding structures 20 is allowed on the active area 16, the peripheral area 18, the first scribe line 12, the second scribe line 14, or a combination thereof. The bonding pad structures 20 may be aligned in a single line or staggered to form CUP (circuit under pad) pads.

The bonding pad structures 20 with a top metal layer design and a passivation opening design for obtaining a metal-free area or a small metal area under a metal pad within a sensing region are described below.

FIRST EMBODIMENT

The present invention provides a bonding pad structure with a top metal layer design for obtaining a metal-free area or a small metal area under a metal pad within a sensing region.

Figure 2A:
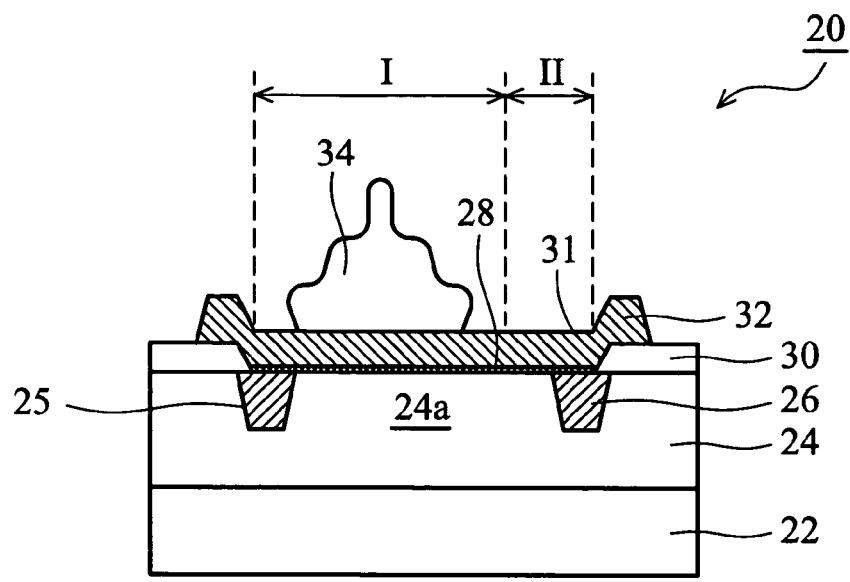
FIG. 2A is a cross-section of a bonding pad structure according to the first embodiment of the present invention.
Figure 2B:
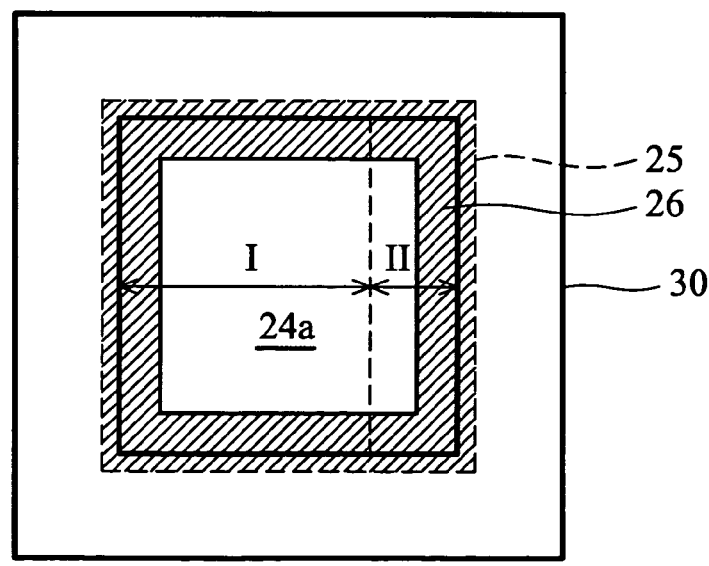
FIG. 2B is a top view of the conductive ring shown in FIG. 2A.

FIG. 2A is a cross-section of a bonding pad structure according to the first embodiment of the present invention. FIG. 2B is a top view of the conductive ring shown in FIG. 2A.

A semiconductor substrate 22 with partially completed integrated circuits has a bonding region I for bonding a ball or a bump and a sensing region II for testing by probe pins or other implement. A first dielectric layer 24, an next level dielectric of the substrate 22, comprises a ring-shaped trench 25 which correspondingly defines a dielectric island 24a. A first conductive layer 26, an uppermost interconnection of the substrate 22, fills the ring-shaped trench 25 to serve as a conductive ring 26, thus enclosing the dielectric island 24a. A passivation layer 30 is formed on the first dielectric layer 24, and has an opening 31 corresponding to the bonding region I and the sensing region II, thus exposing the dielectric island 24a and a sufficient area of the conductive ring 26. A second conductive layer 32 is patterned on the first dielectric layer 24 and the passivation layer 30 within the bonding region I and the sensing region II to serve as a conductive pad 32, in which the conductive pad 32 is directly connected to the conductive ring 26 without requiring via holes. A bonding element 34, such as a ball or a bump, is bonded on the conductive pad 32 within the bonding region I. Moreover, a barrier layer 28 is formed on an interface between the conductive pad 32 and the conductive ring 26 for increasing adhesion therebetween.

The first dielectric layer 24 may be plasma oxide, HDP (high density plasma) oxide, dielectric with high resistance to mechanical stress, low-k dielectrics, fluorinated silicate glass (FSG) or silicon-based dielectrics. The conductive ring 26 may be copper (Cu), aluminum (Al), AlCu alloy, a copper manganese alloy or a copper-containing alloy. The conductive ring 26 is approximately 1~50 μm in width and 0.5~2 μm in depth. Preferably, a measurement ratio $R_1$ satisfies the formula: $R_1=A_r/A_s$ and $0 \leq R_1 \leq 30\%$, where $A_r$ is the area of the conductive ring 26 formed within the sensing region II, and $A_s$ is the area of the sensing region II. The barrier layer 28 may be Ti, TiN, W, WN, Ta, TaN, or a combination thereof. The conductive pad 32 may be aluminum (Al), AlCu alloy or an aluminum-containing alloy. The bonding element 34 may be a gold ball used in wire bonding technology or a metal bump used in a flip chip technology.

In accordance with the top metal layer design, the conductive ring 26 occupies a small area of the sensing region II to achieve a metal-free area or a small metal area, thus overcoming problems caused by the conventional bonding pads and obtains the following advantages. The metal-free area or the small metal area effectively reduces the possibility of cracks penetrating the first dielectric layer 24 to the conductive ring 26, thus preventing corrosion and layer-open problems. The metal-free or small metal area prevents peeling of the conductive pad 32 from the conductive ring 26 or the first dielectric layer 24, thus eliminating pad-open problems and ensuring bonding reliability. Additionally, the pitch and size of the bonding pad structure 20 can be further reduced since the conductive ring 26 is not susceptible to damage from mechanical stress, thus allowing reduction in chip size for next generation technologies. The pad finding capability of the wire bonding tool is effectively improved as only one smooth dielectric island 24a is enclosed by the conductive ring 26. Finally, since the conductive ring 26 is directly connected to the conductive pad 32 without use of via holes or plugs, limitation in ring width and misalignment problems caused by a via hole design are eliminated, and various modifications of the conductive ring 26 and the conductive pad 32 are allowed.

Various modifications of the conductive ring 26 and the conductive pad 32 are herein described.

FIRST EXAMPLE

Based on design requirements of the top metal layer, the interconnections underlying the conductive ring 26 may be modified to have a ring, lattice, island, or solid profile.

Figure 3A:
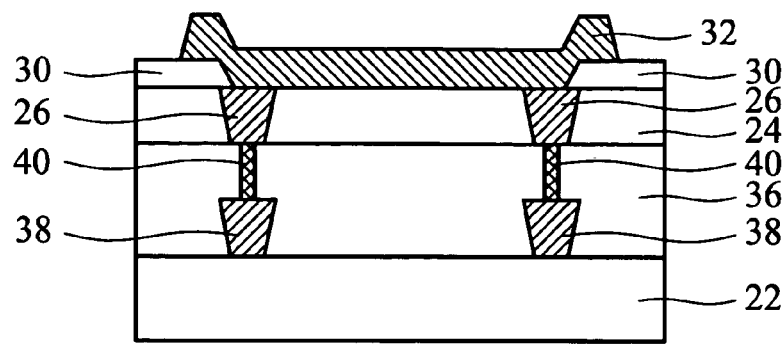
FIG. 3A is a cross-section of another conductive ring underlying the conductive ring.

FIG. 3A is a cross-section of another conductive ring underlying the conductive ring 26. Elements similar to those in FIG. 2A are omitted here. A second dielectric layer 36 underlying the first dielectric layer 24 is provided. A third conductive layer 38 is patterned as a ring and embedded in the second dielectric layer 36. A conductive plug 40 also is formed in the second dielectric layer 36 to electrically connect the conductive ring 26 to the third conductive layer 38.

Figure 3B:
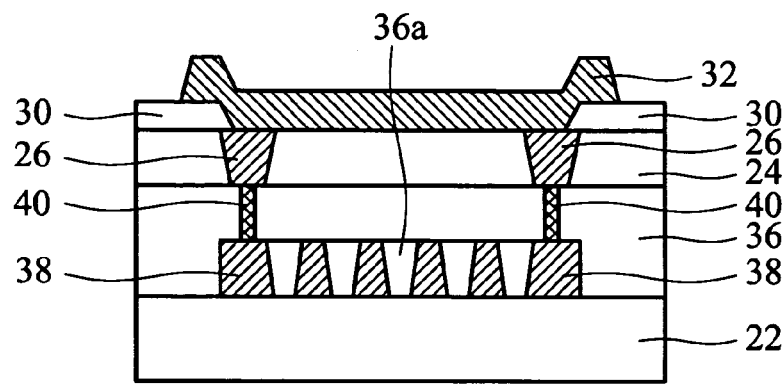
FIG. 3B is a cross-section of a conductive lattice underlying the conductive ring.

FIG. 3B is a cross-section of a conductive lattice underlying the conductive ring 26. Elements similar to those in FIG. 3A are omitted here. The third conductive layer 38 is modified to form a lattice, in which an array of dielectric islands 36a is provided and the dielectric islands 36a are spaced apart from each other by the third conductive layer 38. Alternately, the third conductive layer 38 is modified to form an array of independent plugs spaced apart from each other by the second dielectric layer 36.

Figure 3C:
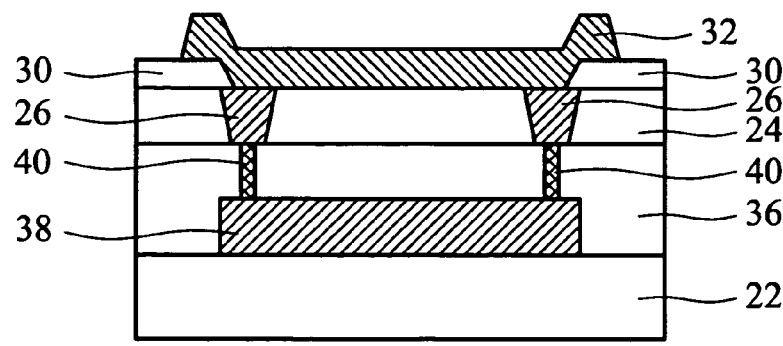
FIG. 3C is a cross-section illustrating a conductive solid underlying the conductive ring.

FIG. 3C is a cross-section illustrating a conductive solid underlying the conductive ring 26. Elements similar to those in FIG. 3A are omitted here. The third conductive layer 38 is modified to have a solid form.

SECOND EXAMPLE

Based on the design requirements of the top metal layer, the conductive ring 26, the conductive pad 32, or a combination thereof may be further modified to have various geometric shapes.

FIGS. 4A~4F are top views illustrating examples of profile designs for the conductive ring 26. FIGS. 5A~5F are top views illustrating examples of the profile designs for the conductive pad 32.

Figure 4A:
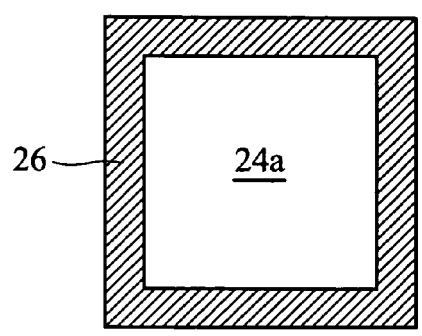
FIGS. 4A~4F are top views illustrating examples of profile designs for the conductive ring.
Figure 4B:
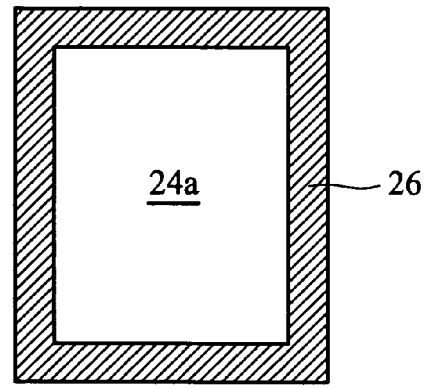

The conductive ring 26 is a quadrilateral ring, and the corresponding dielectric island 24a is a quadrilateral solid. In FIG. 4A, the conductive ring 26 is a square ring, and the corresponding dielectric island 24a is a square solid. In FIG. 4B, the conductive ring 26 is a rectangular ring, and the corresponding dielectric island 24a is a rectangular solid.

Figure 4C:
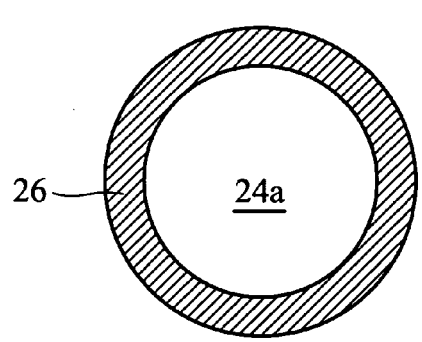
Figure 4D:
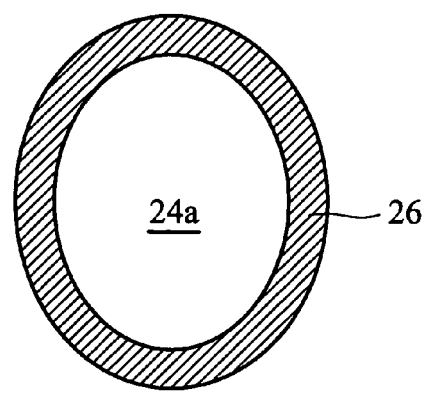

The conductive ring 26 is a circular ring, and the corresponding dielectric island 24a is a circular solid. In FIG. 4C, the conductive ring 26 is a circular ring, and the corresponding dielectric island 24a is a circular solid. In FIG. 4D, the conductive ring 26 is an elliptical ring; and the corresponding dielectric island 24a is an elliptical solid.

Figure 4E:
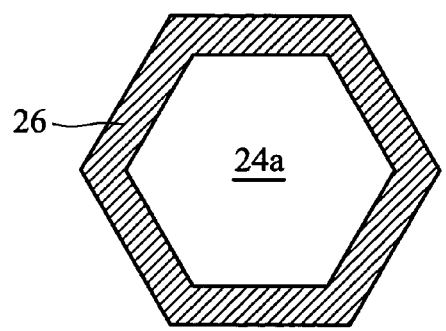
Figure 4F:
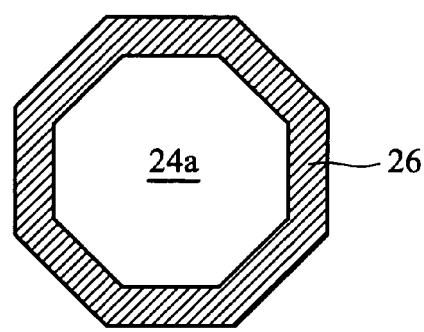

The conductive ring 26 is a polygonal ring, and the corresponding dielectric island 24a is a polygonal solid. In FIG. 4E, the conductive ring 26 is a hexagonal ring, and the corresponding dielectric island 24a is a hexagonal solid. In FIG. 4F, the conductive ring 26 is an octagonal ring, and the corresponding dielectric island 24a is an octagonal solid.

Figure 5A:
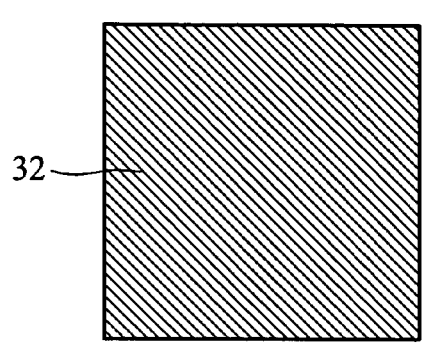
FIGS. 5A~5F are top views illustrating examples of the profile designs for the conductive pad.
Figure 5B:
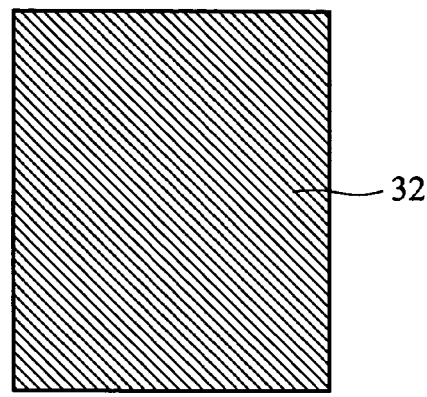
Figure 5C:
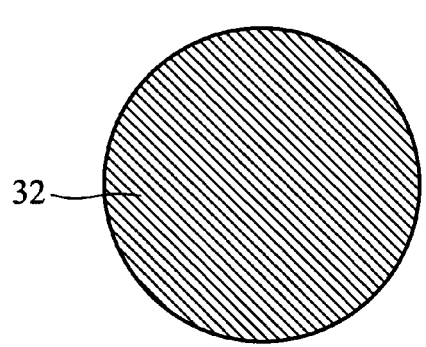
Figure 5D:
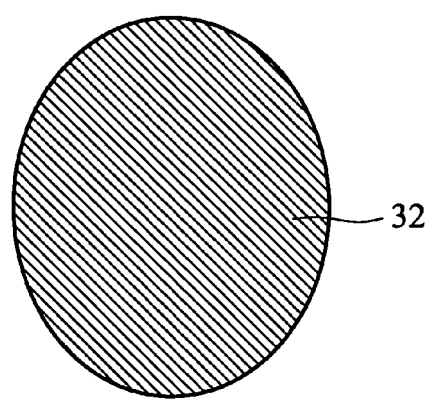
Figure 5E:
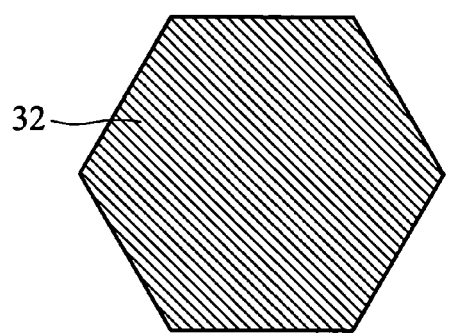
Figure 5F:
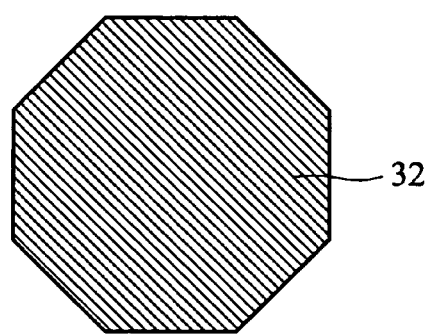

The conductive pad 32 may only be shaped into a geometric solid if the electrical connection between the conductive pad 32 and the conductive ring 26 is reliable. In FIG. 5A, the conductive pad 32 is a square solid. In FIG. 5B, the conductive pad 32 is a rectangular solid. In FIG. 5C, the conductive pad 32 is a circular solid. In FIG. 5D, the conductive pad 32 is an elliptical solid. In FIG. 5E, the conductive pad 32 is a hexagonal solid. In FIG. 5F, the conductive pad 32 is an octagonal solid.

THIRD EXAMPLE

Based on a quadrilateral design for the conductive ring 26 or the conductive pad 32, at least one corner cut portion is provided to prevent peeling.

Figure 6A:
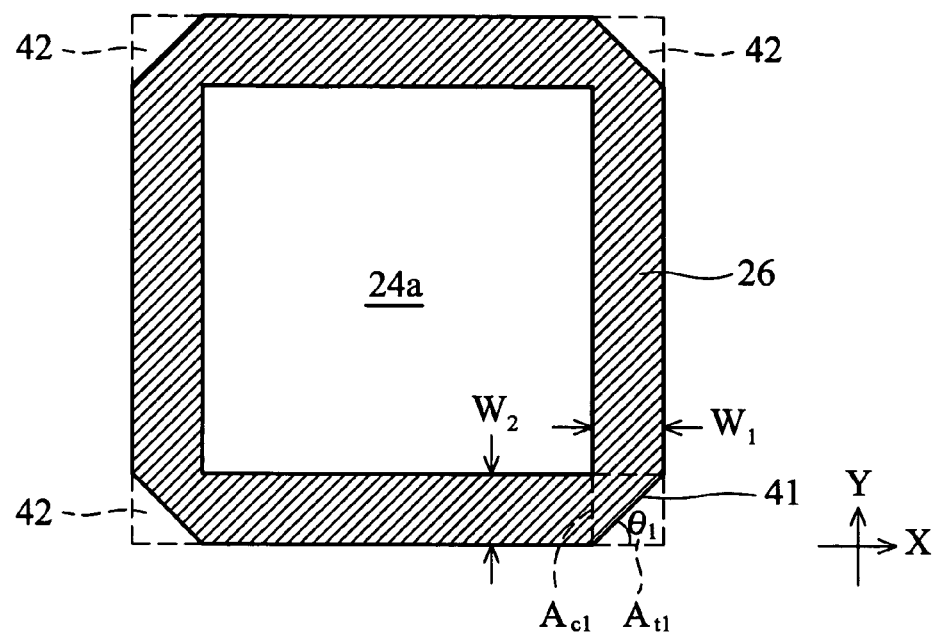
FIG. 6A is a top view of corner cut portions of the conductive ring.
Figure 6B:
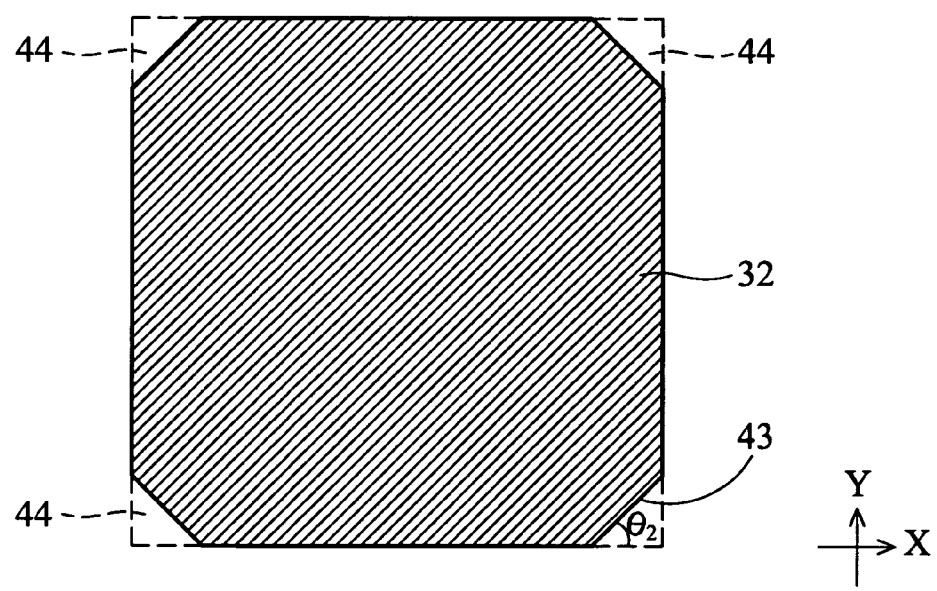
FIG. 6B is a top view of corner cut portions of the conductive pad.

FIG. 6A is a top view of corner cut portions of the conductive ring 26. FIG. 6B is a top view of corner cut portions of the conductive pad 32. Elements similar to those in FIG. 2B are omitted here.

In FIG. 6A, the conductive ring 26 comprises four corner cut portions 42 adjacent to four corners of the quadrilateral ring, respectively. The corner cut portion 42 prohibits the formation of the first conductive layer 26, but allows the formation of the first dielectric layer 24. Preferably, the corner cut portion 42 is a right triangle, where the hypotenuse 41 is approximately 0.5~5 μm in length, an included angle $\theta_1$ between the hypotenuse 41 and the X axis is approximately 10°~80°, and a measurement ratio $R_2$ satisfies the formula: $R_2 = A_{t1}/A_{c1}$ and $0 < R_2 < 80\%$, where $A_{t1}$ is the area of the corner cut portion 42, and $A_{c1}$ is the corner area of the conductive ring 26. The corner area $A_{c1}$ satisfies the formula: $A_{c1} = W_1 \times W_2$, where $W_1$ is the X-axis width of the conductive ring 26, $W_2$ is the Y-axis width of the conductive ring 26, $W_1 = 1$ μm~10 μm, and $W_2 = 1$ μm~10 μm.

In FIG. 6B, the conductive pad 32 comprises four corner cut portions 44 adjacent to four corners of the quadrilateral solid, respectively. The corner cut portion 44 prohibits the formation of the second conductive layer 32, but allows the formation of the passivation layer 30. Preferably, the corner cut portion 44 is a right triangle, where the hypotenuse 43 is approximately 0.5~10 μm in length, and an included angle $\theta_2$ between the hypotenuse 41 and the X axis is approximately 10°~80°.

FOURTH EXAMPLE

In order to clearly discriminate the sensing region II from the bonding region I, a marking notch is provided on the conductive ring 26, the conductive pad 32, or a combination thereof.

Figure 7A:
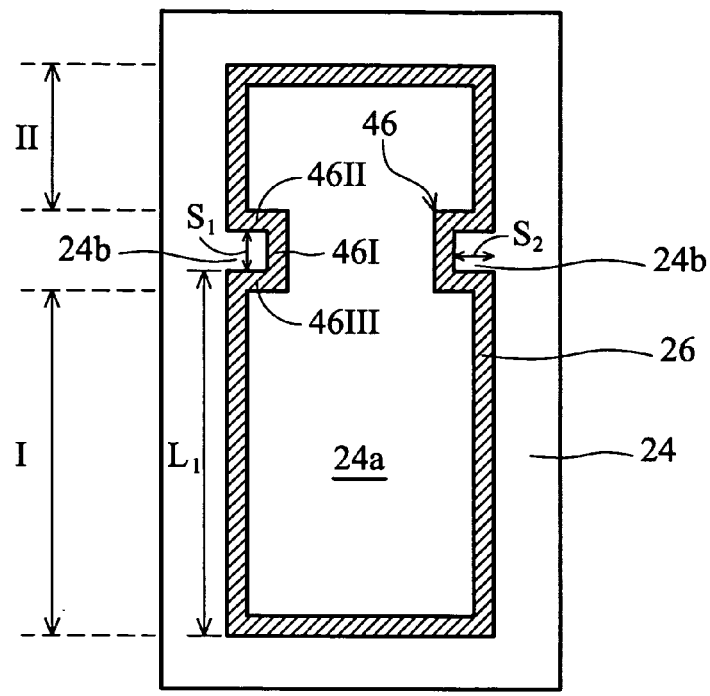
FIG. 7A is a top view of the conductive ring with a marking notch.
Figure 7B:
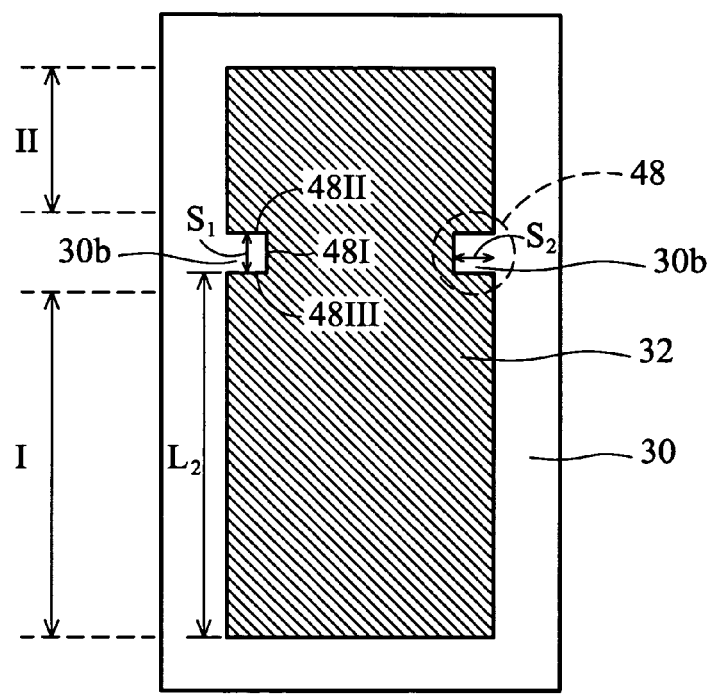
FIG. 7B is a top view of the conductive pad with a marking notch.

FIG. 7A is a top view of the conductive ring 26 with a marking notch. FIG. 7B is a top view of the conductive pad 32 with a marking notch. Elements similar to those in FIG. 2B are omitted here.

In FIG. 7A, the conductive ring comprises two marking notches 46, and two dielectric markings 24b are correspondingly defined within the two marking notches 46, respectively. The two marking notches 46 are approximately aligned in a line to delineate the sensing region II from the bonding region I. Each of the two marking notches 46 is composed of a bottom side 46I and two lateral sides 46II and 46III. Preferably, a first-direction length $L_1$ from the lateral side 46III to the edge of the conductive ring 26 for defining the bonding region I is approximately 40~60 μm. Preferably, a first length $S_1$ of the dielectric marking 24b, parallel to the bottom side 46I, is approximately 1~3 μm. Preferably, a second length $S_2$ of the dielectric marking 24b, parallel to the lateral side 46II, is approximately 0.5~2 μm.

In FIG. 7B, the conductive pad 32 comprises two marking notches 48, and two passivation markings 30b are correspondingly defined within the two marking notches 48, respectively. The two marking notches 48 are approximately aligned in a line to delineate the sensing region II from the bonding region I. Each of the two marking notches 48 is composed of a bottom side 48I and two lateral sides 48II and 48III. Preferably, a first-direction length $L_2$ from the lateral side 48III to the edge of the conductive pad 32 for defining the bonding region I is approximately 40~60 μm. Preferably, a first length $S_1$ of the passivation marking 30b, parallel to the bottom side 48I, is approximately 1~3 μm. Preferably, a second length $S_2$ of the passivation marking 30b, parallel to the lateral side 48II, is approximately 0.5~2 μm.

Additionally, the marking notch design for the conductive ring 26 and the conductive pad 32 can be combined with the corner cut designs as described in FIGS. 6A and 6B.

Figure 8A:
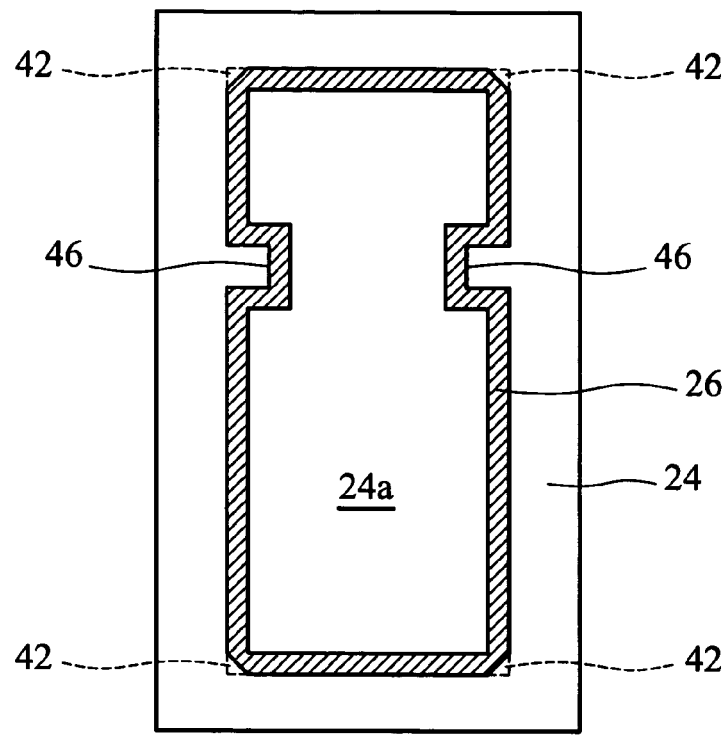
FIG. 8A is a top view of the conductive ring with the marking notches and the corner cut portions.
Figure 8B:
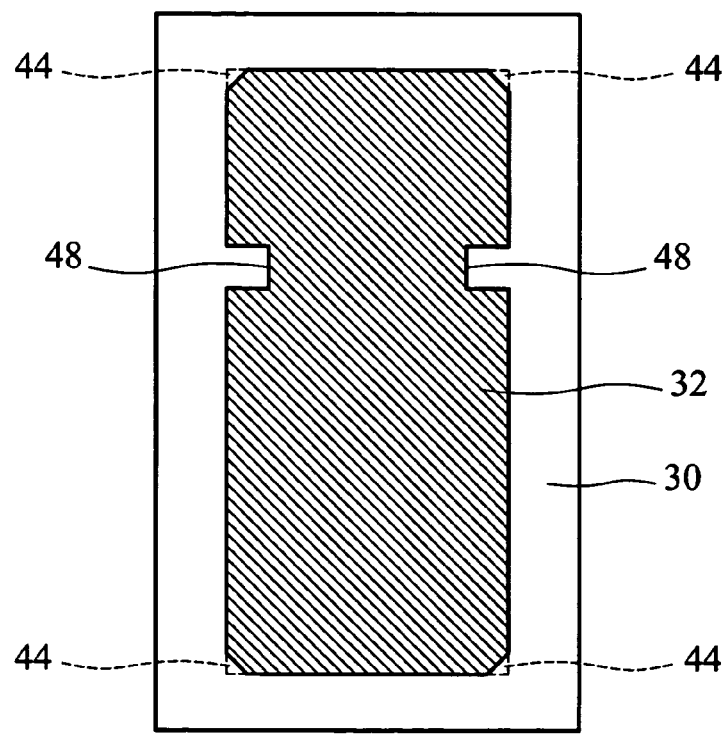
FIG. 8B is a top view of the conductive pad with the marking notches and the corner cut portions.

FIG. 8A is a top view of the conductive ring 26 with the marking notches 46 and the corner cut portions 42. FIG. 8B is a top view of the conductive pad 32 with the marking notches 48 and the corner cut portions 44. Elements similar to those in FIGS. 6~7 are omitted here.

FIFTH EXAMPLE

Based on the design requirements of the top metal layer, a circuit under pad (CUP) scheme can be further provided under an extension portion the conductive ring 26. Locating the circuit under the pad shortens some of the conductors and thereby decreases their inductance and resistance and also reduces the parasitic capacitance of the circuit.

Figure 9A:
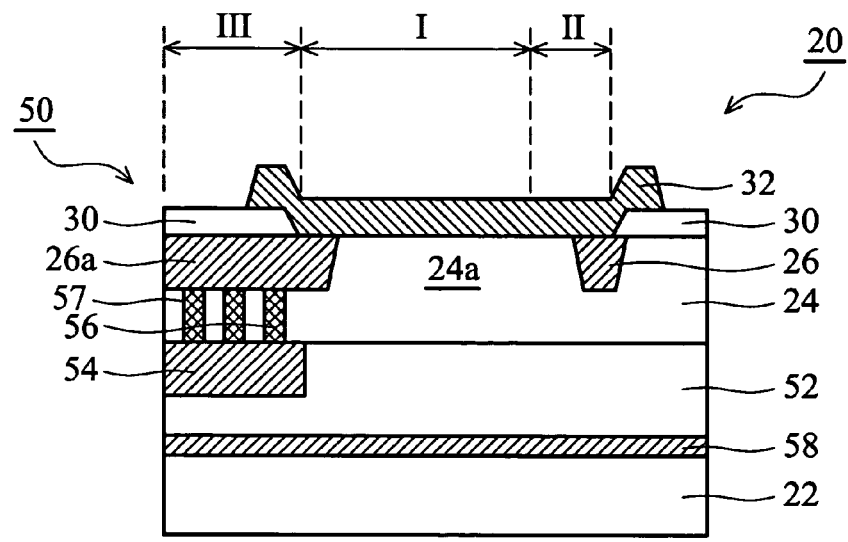
FIG. 9A is a cross-section of a CUP scheme adjacent to the bonding pad structure.
Figure 9B:
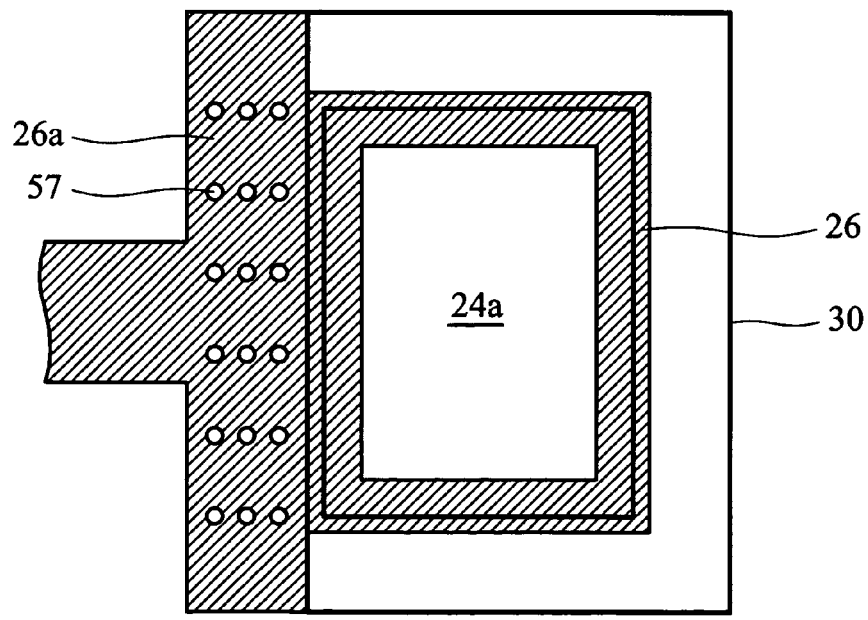
FIG. 9B is a top view of the conductive ring and the CUP scheme shown in FIG. 9A.

FIG. 9A is a cross-section of a CUP scheme 50 adjacent to the bonding pad structure 20. FIG. 9B is a top view of the conductive ring 26 and the CUP scheme 50 shown in FIG. 9A. Elements similar to those in FIGS. 6~7 are omitted here.

The conductive ring 26 comprises an extension portion 26a which extends from one peripheral edge of the conductive ring 26 and away from the bonding region I and the sensing region II. A CUP scheme 50 is formed adjacent to the extension portion 26a. A buffer layer 52 is formed underneath the first dielectric layer 24 and has a circuit scheme 54 patterned therein. A plurality of conductive plugs 56 is formed in an array of via holes 57 of the first dielectric layer 24. Thus, the extension portion 26a can be electrically connected to the circuit scheme 54 through via holes 57. Also, the circuit scheme 54 can be electrically connected to a lowermost conductive layer 58 through interconnections. Preferably, the number of via holes 57 for a signal circuit scheme is smaller than that for a power circuit scheme.

In addition, based on a combination of the conductive ring 26 and the CUP scheme 50, the buffer layer 52 may be optional, and the conductive layers underlying the conductive ring 26 may be modified.

Figure 10A:
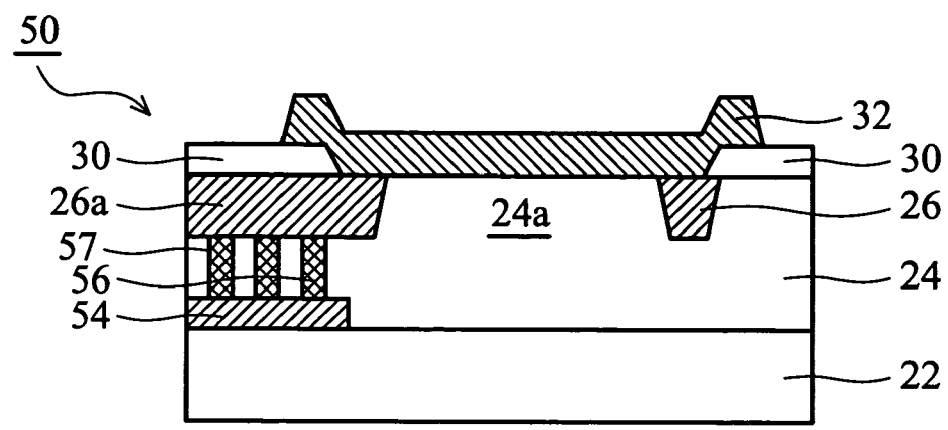
FIG. 10A is a cross-section of one example of forming the CUP scheme without using the buffer layer.

FIG. 10A is a cross-section of one example of forming the CUP scheme 50 without using the buffer layer 52. Elements similar to those in FIG. 9A are omitted here. The different portion is that the buffer layer 52 is omitted, thus the circuit scheme 54 is formed in the first dielectric layer 24.

Figure 10B:
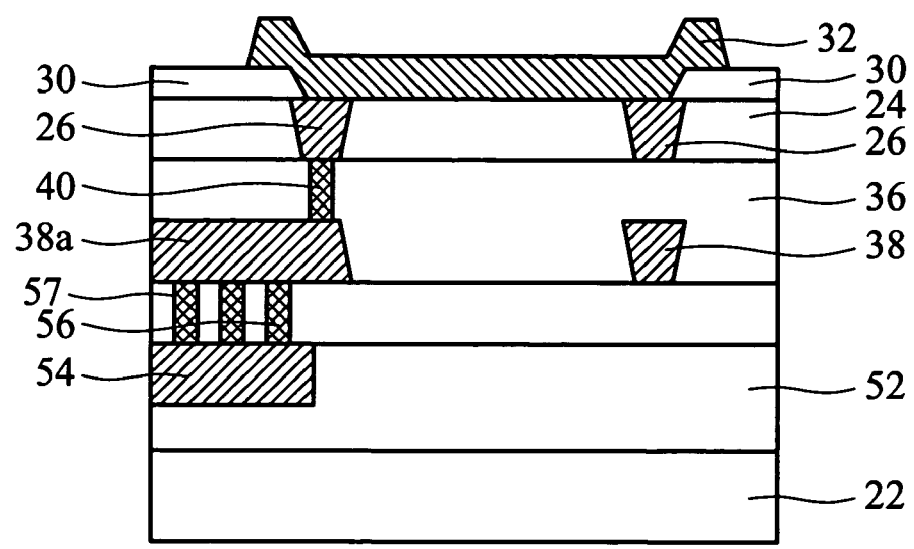
FIG. 10B is a cross-section of forming the CPU scheme under two layers of conductive ring.

FIG. 10B is a cross-section of another example of forming the CUP scheme 50 underneath two conductive rings. Elements similar to those in FIG. 9A are omitted here. The different portion is that the third conductive layer 38 is patterned as a ring and embedded in the second dielectric layer 36, and is electrically connected to the conductive ring 26 through the conductive plug 40. Also, the third conductive layer 38 has an extension portion 38a which extends from one peripheral edge of the ring to be electrically connected to the circuit scheme 54 through via holes 57.

SECOND EMBODIMENT

The present invention provides a bonding pad structure with a passivation opening design for protecting a top metal layer within a sensing region.

Figure 11A:
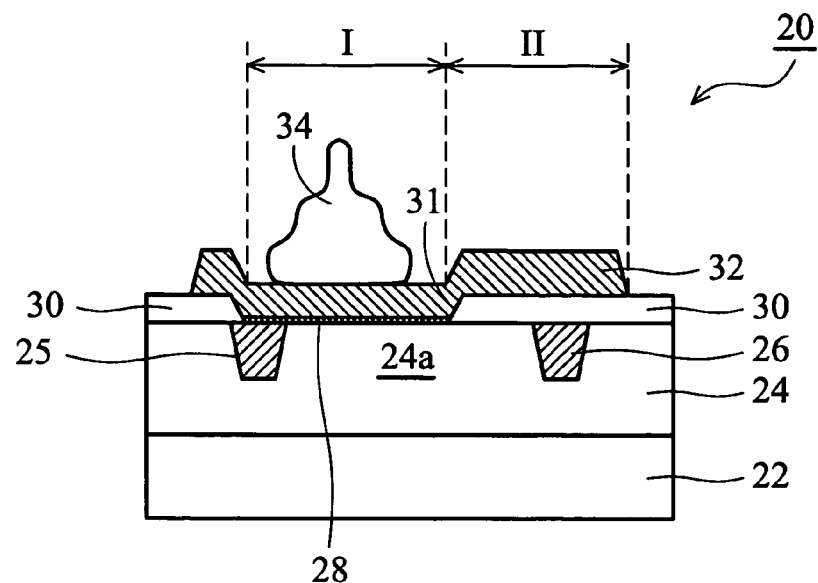
FIG. 11A is a cross-section of a bonding pad structure according to the second embodiment of the present invention.
Figure 11B:
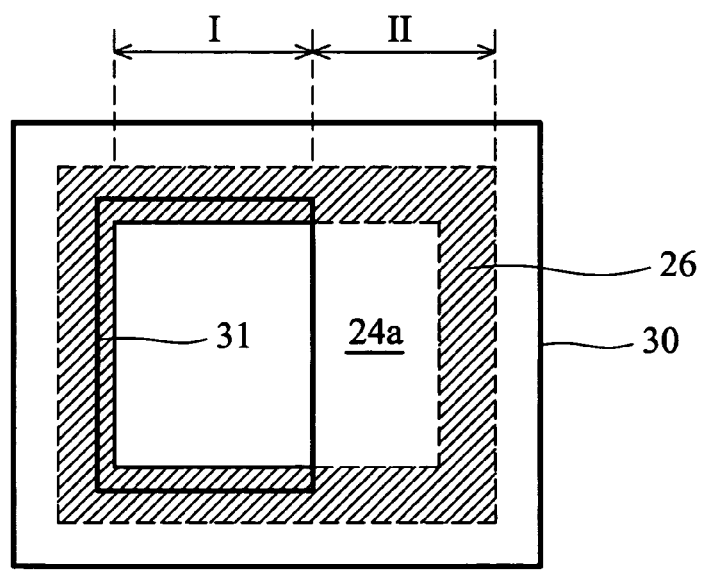
FIG. 11B is a top view of the conductive ring and the passivation layer shown in FIG. 11A.

FIG. 11A is a cross-section of a bonding pad structure according to the second embodiment of the present invention. FIG. 11B is a top view of the conductive ring 26 and the passivation layer 30 shown in FIG. 11A.

A semiconductor substrate 22 with partially completed integrated circuits has a bonding region I for bonding a ball or a bump and a sensing region II for testing by probe pins or other implement. A first dielectric layer 24, an uppermost dielectric of the substrate 22, comprises a ring-shaped trench 25 which correspondingly defines a dielectric island 24a. A first conductive layer 26, an uppermost conductive layer of interconnections in the substrate 22, fills the ring-shaped trench 25 to serve as a conductive ring 26, thus enclosing the dielectric island 24a. A passivation layer 30 is formed on the first dielectric layer 24, and has an opening 31 corresponding to the bonding region I, thus covering the conductive ring 26 located within the sensing region II. A second conductive layer 32 is formed overlying the first dielectric layer 24 and the passivation layer 30 within the bonding region I and the sensing region II to serve as a conductive pad 32, in which the conductive pad 32 is directly connected to the conductive ring 26 without requiring via holes. A bonding element 34, such as a ball or a bump, is bonded to the conductive pad 32 within the bonding region I. Moreover, a barrier layer 28 is provided on an interface between the conductive pad 32 and the conductive ring 26.

Preferably, the first dielectric layer 24 may be plasma oxide, HDP (high density plasma) oxide, dielectric with high resistance to mechanical stress, low-k dielectrics, FSG, or silicon-based dielectrics. The conductive ring 26 may be copper (Cu), aluminum (Al), AlCu alloy, a copper manganese alloy or a copper-containing alloy. The conductive ring 26 is approximately 1~50 μm in width and 0.5~2 μm in depth. The barrier layer 28 may be Ti, TiN, W, WN, Ta, TaN, or a combination thereof. The conductive pad 32 may be aluminum (Al), AlCu alloy or an aluminum-containing alloy. The bonding element 34 may be a gold ball used in wire bonding technology or a metal bump used in a flip chip technology.

Accordingly, the passivation layer 30 covers the conductive ring 26 within the sensing region II to prevent damage to the conductive ring 26 within the sensing region caused by mechanical stress. The passivation layer 30 adjacent to the demarcation between the bonding region I and the sensing region II can also serve as a marking strip, which has the same function of the marking notches as described in FIGS. 7A and 7B. In addition, other interconnections underlying the conductive ring 26 may be modified to have a ring, lattice, island, or solid profile as disclosed in FIGS. 3A~3C.

The passivation opening design for the passivation layer 30 achieves the following advantages. The passivation layer 30 covers the conductive ring 26 within the sensing region II to prohibit dielectric cracks from penetrating into the conductive ring 26, thus preventing corrosion and layer-open problems. The passivation layer also prevents peeling of the conductive pad 32 from the conductive ring 26 or the first dielectric layer 24, thus eliminating a pad-open problem and ensuring bonding reliability. The pitch and size of the bonding pad structure 20 can be further reduced since the conductive ring 26 is not susceptible to damage from mechanical stress, thus allowing chip size reduction for next generation technologies. The pad finding capability can be effectively improved during wire bonding as only one dielectric island 24a is enclosed by the conductive ring 26,. Finally, the conductive ring 26 is directly connected to the conductive pad 32 without use of via holes or plugs, thus limitation in ring width and misalignment problems caused by via hole design are eliminated, enabling various modifications of the conductive ring 26 and the conductive pad 32.

Various modifications of the conductive ring 26 and the conductive pad 32 are herein described.

FIRST EXAMPLE

Based on the passivation opening design rule, the first conductive layer 26 may be further modified to have a lattice form or as independent plugs.

Figure 12A:
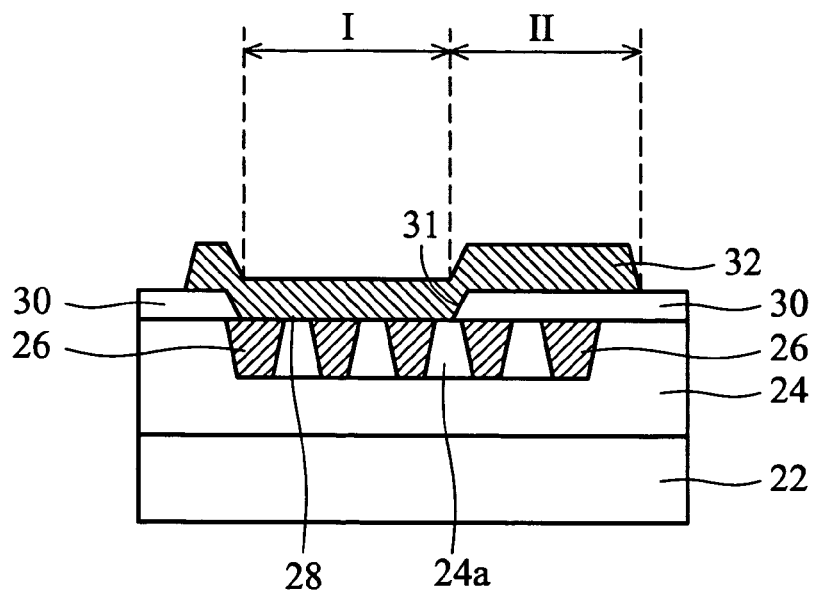
FIG. 12A is a cross-section of the first conductive layer patterned as a lattice.
Figure 12B:
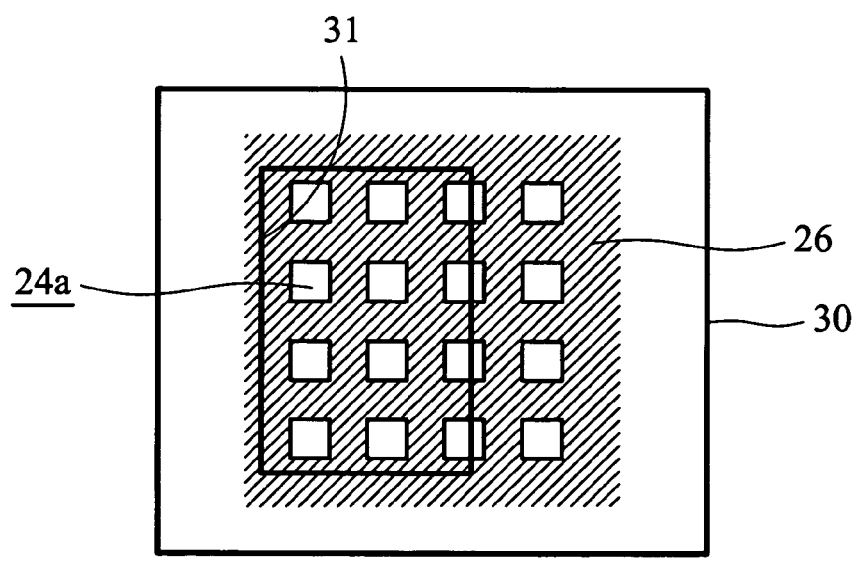
FIG. 12B is a top view of the conductive layer shown in FIG. 12A.

FIG. 12A is a cross-section of the first conductive layer 26 patterned as a lattice form. FIG. 12B is a top view of the first conductive layer 26 shown in FIG. 12A. Elements similar to those in FIGS. 11A and 11B are omitted here. The first dielectric layer 24 comprises a plurality of dielectric islands 24a. The first conductive layer 26 fill the trenches of the first dielectric layer 24 to completely surround the dielectric islands 24a, thus achieving a lattice form.

Figure 13A:
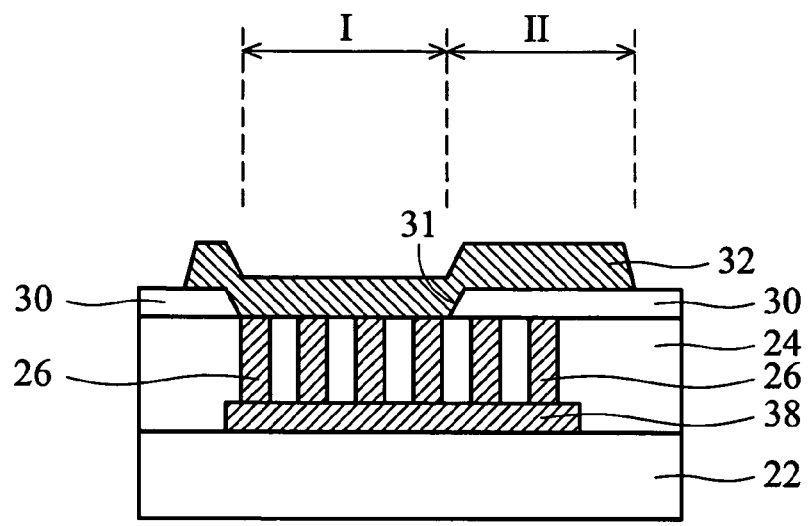
FIG. 13A is a cross-section of the first conductive layer patterned as independent plugs.
Figure 13B:
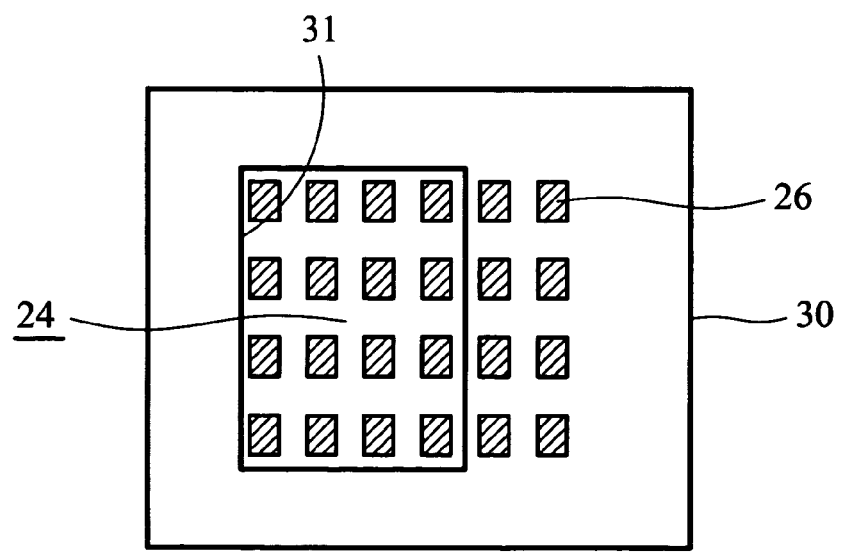
FIG. 13B is a top view of the conductive layer shown in FIG. 13A.

FIG. 13A is a cross-section of the first conductive layer 26 patterned as independent plugs. FIG. 13B is a top view of the first conductive layer 26 shown in FIG. 13A. Elements similar to those in FIGS. 11A and 11B are omitted here. The first dielectric layer 24 comprises a plurality of via holes. The first conductive layer 26 fills the via holes of the first dielectric layer 24 to form a plurality of independent plugs 26. Additionally, the independent plugs 26 can be electrically connected to each other through a third conductive layer 38 underlying the plugs 26.

Other interconnections underlying the first conductive layer 26 may also be modified to have a ring, lattice, island, or solid profile as disclosed in FIGS. 3A~3C.

SECOND EXAMPLE

Based on the passivation opening design rule, the first conductive layer 26 may be further modified to have a solid form.

Figure 14A:
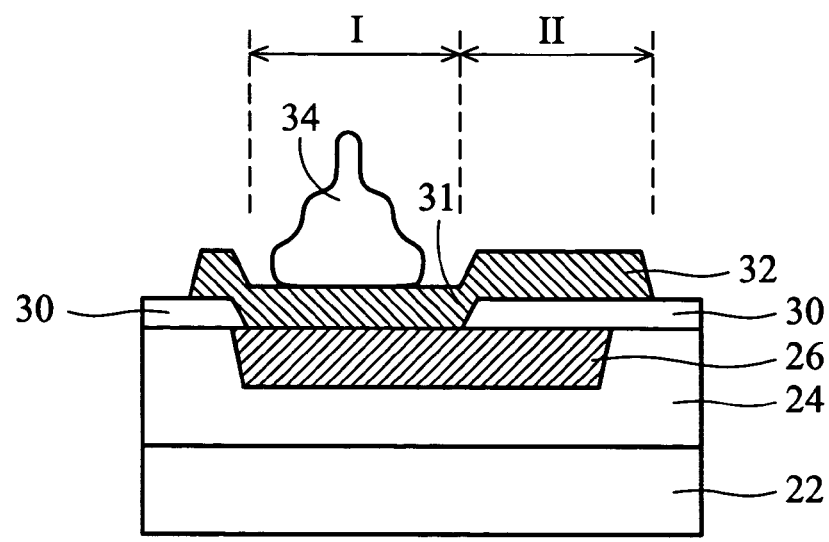
FIG. 14A is a cross-section of the first conductive layer patterned as a solid form.
Figure 14B:
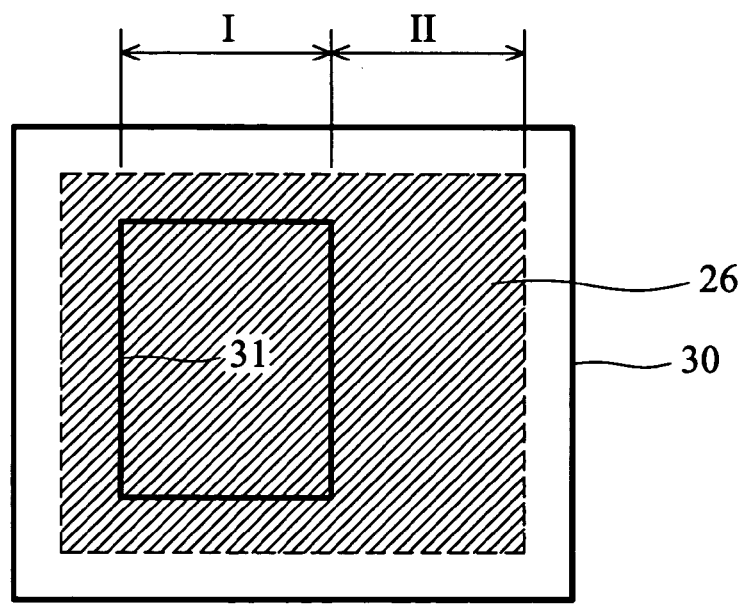
FIG. 14B is a top view of the conductive layer shown in FIG. 14A.

FIG. 14A is a cross-section of the first conductive layer 26 patterned as a solid form. FIG. 14B is a top view of the first conductive layer 26 shown in FIG. 14A. Elements similar to those in FIGS. 11A and 11B are omitted here. The first conductive layer 26 fills a large-size trench of the first dielectric layer 24 to become a solid form. In addition, other interconnections underlying the first conductive layer 26 may be modified to have ring, lattice, island, or solid profiles as disclosed in FIGS. 3A~3C.

THIRD EXAMPLE

Based on the passivation opening design rule, the first conductive layer 26, the conductive pad 32 or a combination thereof may be further modified to have various profiles including quadrilateral, circular and polygonal profiles as described in FIGS. 4A~4F and FIGS. 5A~5F. Features similar to those in FIGS. 4~5 are omitted here.

FOURTH EXAMPLE

Based on the passivation opening design rule, the first conductive layer 26, the conductive pad 32 or a combination thereof may be further modified with at least one corner cut portion as described in FIGS. 6A and 6B. Features similar to those in FIGS. 6A and 6B are omitted here.

FIFTH EXAMPLE

Based on the passivation opening design rule, the first conductive layer 26, the conductive pad 32 or a combination thereof may be further modified with a marking notch as described in FIGS. 7A and 7B and FIGS. 8A and 8B. Features similar to those in FIGS. 7~8 are omitted here.

SIXTH EXAMPLE

Based on the passivation opening design rule, a circuit under pad (CUP) scheme 50 can be provided under an extension portion 26a the first conductive layer 26 as described in FIGS. 9~10. Features similar to those in FIGS. 9~10 are omitted here.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A bonding pad structure, comprising:
   a substrate having a bonding region and a sensing region;
   a first dielectric layer formed overlying the substrate and having a dielectric island surrounded by a ring-shaped trench;
   a first conductive layer formed in the ring-shaped trench of the first dielectric layer;
   a passivation layer formed overlying the first dielectric layer and having an opening, wherein the opening corresponds to the bonding region and the sensing region and exposes the dielectric island and a part of the first conductive layer; and
   a second conductive layer covering the opening of the passivation layer and electrically connected to the first conductive layer.

2. The bonding pad structure as claimed in claim 1, wherein the substrate farther comprises:
   a main area comprising an active area and a peripheral area;
   a first scribe line extending along a first direction; and
   a second scribe line extending along a second direction, wherein the intersection of the first scribe line and the second scribe line defines the main area;
   wherein, the bonding pad structure is formed overlying the active area, the peripheral area, the first scribe line, the second scribe line or a combination thereof.

3. A chip comprising bonding pad structures as claimed in claim 2, wherein the bonding pad structures are arranged in a single line or staggered.

4. The bonding pad structure as claimed in claim 1, wherein the width of the first conductive layer is 1~50 μm.

5. The bonding pad structure as claimed in claim 1, wherein the depth of the first conductive layer is 0.5~2 μm.

6. The bonding pad structure as claimed in claim 1, wherein a measurement ratio $R_1$ satisfies the formula: $R_1 = A_r/A_s$ and $0 \leq R_1 \leq 30\%$, where $A_r$ is an area of the first conductive layer within the sensing region, and $A_s$ is the area of the sensing region.

7. The bonding pad structure as claimed in claim 1, further comprising:
 a second dielectric layer formed underlying the first dielectric layer;
 a third conductive layer formed in the second dielectric layer; and
 at least one conductive plug formed in the second dielectric layer and electrically connecting the third conductive layer to the first conductive layer.

8. The bonding pad structure as claimed in claim 7, wherein the third conductive layer is a ring, a lattice form, an array of islands or a solid form.

9. The bonding pad structure as claimed in claim 1, wherein the trench of the first dielectric layer is a quadrilateral ring, a circular ring, a hexagonal ring, an octagonal ring or a polygonal ring.

10. The bonding pad structure as claimed in claim 1, wherein the first conductive layer is a quadrilateral ring, a circular ring, a hexagonal ring, an octagonal ring or a polygonal ring.

11. The bonding pad structure as claimed in claim 1, wherein the second conductive layer is a quadrilateral solid, a circular solid, a hexagonal solid, an octagonal solid or a polygonal solid.

12. The bonding pad structure as claimed in claim 1, further comprising at least one corner cut portion adjacent to at least one corner of the first conductive layer, wherein the corner cut portion prohibits the formation of the first conductive layer and allows the formation of the first dielectric layer.

13. The bonding pad structure as claimed in claim 12, wherein the corner cut portion is a right triangle, the hypotenuse length of the right triangle is 0.5~μm, and an included angle $\theta_1$ between the hypotenuse and X axis is 10°~80°.

14. The bonding pad structure as claimed in claim 12, wherein a measurement ratio $R_2$ satisfies the formula: $R_2 = A_{t1}/A_{c1}$, $A_{c1} = W_1 \times W_2$, and $0 < R_2 < 80\%$, where $A_{t1}$ is the area of the corner cut portion, $A_{c1}$ is the corner area of the first conductive layer, $W_1$ is a first-direction width of the corner area of the first conductive layer, and W2 is a second-direction width of the corner area of the first conductive layer.

15. The bonding pad structure as claimed in claim 1, further comprising at least one corner cut portion adjacent to at least one corner of the second conductive layer, wherein the corner cut portion prohibits the formation of the second conductive layer and allows the formation of the passivation layer.

16. The bonding pad structure as claimed in claim 15, wherein the corner cut portion is a right triangle, the hypotenuse length of the tight triangle is 0.5~10 μm, and an included angle $\theta_2$ between the hypotenuse and X axis is 10°~80°.

17. The bonding pad structure as claimed in claim 1, wherein the first conductive layer further comprises at least one marking notch which delineates the sensing region from the bonding region.

18. The bonding pad structure as claimed in claim 17, wherein the marking notch of the first conductive layer comprises a bottom side and two lateral sides which surround the first dielectric layer to define a dielectric marking.

19. The bonding pad structure as claimed in claim 18, wherein a first length of the dielectric marking parallel to the bottom side of the marking notch is 1~3 μm, and a second length of the dielectric marking parallel to the lateral side of the marking notch is 0.5~2 μm.

20. The bonding pad structure as claimed in claim 1, wherein the second conductive layer further comprises at least one marking notch which delineates the sensing region from the bonding region.

21. The bonding pad structure as claimed in claim 20, wherein the marking notch of the second conductive layer comprises a bottom side and two lateral sides which surround the passivation dielectric layer to define a passivation marking.

22. The bonding pad structure as claimed in claim 21, wherein a first length of the passivation marking parallel to the bottom side of the marking notch is 1~3 μm, and a second length of the passivation marking parallel to the lateral side of the marking notch is 0.5~2 μm.

23. The bonding pad structure as claimed in claim 1, further comprising:
 an extension portion of the first conductive layer extending away from the bonding region and the sensing region; and
 a circuit under pad (CUP) scheme formed underlying the extension portion of the first conductive layer.

24. The bonding pad structure as claimed in claim 23, wherein the circuit under pad (CUP) scheme comprises:
 a circuit scheme formed underlying the extension portion of the first conductive layer; and
 a plurality of conductive plugs electrically connecting the circuit scheme to the extension portion of the first conductive layer.

25. The bonding pad structure as claimed in claim 24, wherein the circuit under pad (CUP) scheme comprises:
 a buffer layer formed underlying the first dielectric layer, wherein the circuit scheme is formed in the buffer layer; and
 a plurality of via holes formed in the first dielectric layer and underlying the extension portion of the first conductive layer, wherein the conductive plugs are formed in the via holes respectively.

26. The bonding pad structure as claimed in claim 24, wherein the circuit under pad (CUP) scheme comprises:
 a plurality of via holes formed in the first dielectric layer and underlying the extension portion of the first conductive layer,
 wherein the conductive plugs are formed in the via boles respectively; and
 wherein the circuit scheme is formed in the first dielectric layer and underlying the conductive plugs.

27. The bonding pad structure as claimed in claim 23, wherein the circuit under pad (CUP) scheme comprises:
 a second dielectric layer formed underlying the first dielectric layer;
 a third conductive layer formed in the second dielectric layer and electrically connected to the first conductive layer;
 an extension portion of the third conductive layer extending away from the bonding region and the sensing region;

a buffer layer formed underlying the second dielectric layer;

a circuit scheme formed in the buffer layer; and a plurality conductive plugs electrically connecting the circuit scheme to the extension portion of the third conductive layer.

28. The bonding pad structure as claimed in claim 27, wherein the third conductive layer is a ring, a lattice form, an array of islands or a solid form.

29. The bonding pad structure as claimed in claim 1, further comprising a bonding element formed overlying the second conductive layer within the banding region.

30. The bonding pad structure as claimed in claim 29, wherein the bonding element is a conductive ball or a conductive bump.

31. The bonding pad structure as claimed in claim 1, further comprising a barrier layer formed between the first conductive layer and the second conductive layer.

32. The bonding pad structure as claimed in claim 31, wherein the barrier layer is Ti, TiN, W, WN, Ta, TaN or a combination thereof.

33. The bonding pad structure as claimed in claim 1, wherein the first conductive layer is copper (Cu), aluminum (Al), AlCu alloy, a copper manganese alloy or a copper-containing alloy.

34. The bonding pad structure as claimed in claim 1, wherein the second conductive layer is aluminum (Al), AlCu alloy or an aluminum-containing alloy.

35. The bonding pad structure as claimed in claim 1, wherein the first dielectric layer is plasma oxide, HDP oxide, dielectric with high resistance to mechanical stress, low-k dielectrics, fluorinated silicate glass (FSG) or silicon-based dielectrics.

* * * * *